United States Patent
Nagasu et al.

(10) Patent No.: US 9,378,869 B2
(45) Date of Patent: Jun. 28, 2016

(54) SUPERCONDUCTIVE WIRE MATERIAL SUBSTRATE, MANUFACTURING METHOD THEREOF AND SUPERCONDUCTIVE WIRE MATERIAL

(75) Inventors: Yoshinori Nagasu, Tokyo (JP); Masaru Higuchi, Tokyo (JP); Hisaki Sakamoto, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 361 days.

(21) Appl. No.: 13/816,619

(22) PCT Filed: Nov. 15, 2011

(86) PCT No.: PCT/JP2011/076255
§ 371 (c)(1),
(2), (4) Date: Feb. 12, 2013

(87) PCT Pub. No.: WO2013/073002
PCT Pub. Date: May 23, 2013

(65) Prior Publication Data
US 2013/0240246 A1    Sep. 19, 2013

(51) Int. Cl.
*H01B 12/06* (2006.01)
*H01L 39/24* (2006.01)
*H01B 13/00* (2006.01)

(52) U.S. Cl.
CPC ........... *H01B 12/06* (2013.01); *H01B 13/00* (2013.01); *H01L 39/2454* (2013.01)

(58) Field of Classification Search
USPC ..................................................... 174/125.1
See application file for complete search history.

(56) References Cited

U.S. PATENT DOCUMENTS

| 4,571,274 A | * | 2/1986 | Yanagishima et al. ......... 148/500 |
| 5,746,081 A | * | 5/1998 | Klamma ................... B21B 1/36 |
| | | | 72/229 |
| 2001/0047576 A1 | * | 12/2001 | Love, III .................. B24C 1/086 |
| | | | 29/81.06 |
| 2006/0219322 A1 | * | 10/2006 | Fujino ................. H01L 39/2454 |
| | | | 148/96 |
| 2010/0016169 A1 | | 1/2010 | Horimoto et al. |
| 2010/0160170 A1 | | 6/2010 | Horimoto et al. |

FOREIGN PATENT DOCUMENTS

CN    1191780 A    9/1998
(Continued)

OTHER PUBLICATIONS

International Preliminary Report on Patentability issued May 20, 2014 in PCT/JP2011/076255 filed Nov. 15, 2011.
(Continued)

*Primary Examiner* — William H Mayo, III
*Assistant Examiner* — Krystal Robinson
(74) *Attorney, Agent, or Firm* — Oblon, McClelland, Maier & Neustadt, L.L.P.

(57) ABSTRACT

A superconductive wire material substrate which is formed such that a surface roughness Ra of one surface is 10 nm or less, and a surface roughness Ra of an other surface is larger than the surface roughness Ra of the one surface, and is 8 nm or more and less than 15 nm, between the surface roughnesses Ra of both surfaces of the superconductive wire material substrate.

9 Claims, 2 Drawing Sheets

(56) References Cited

FOREIGN PATENT DOCUMENTS

| | | |
|---|---|---|
| CN | 101496118 A | 7/2009 |
| EP | 1 995 798 A2 | 11/2008 |
| JP | 2 251301 | 10/1990 |
| JP | 4 110454 | 4/1992 |
| JP | 4 329867 | 11/1992 |
| JP | 11-77107 | 3/1999 |
| JP | 2007 200870 | 8/2007 |
| JP | 2007 311234 | 11/2007 |
| JP | 2008 36724 | 2/2008 |
| JP | 2008 049451 | 3/2008 |
| JP | 2008 200773 | 9/2008 |
| JP | 2008 200775 | 9/2008 |
| JP | 2008200775 A * | 9/2008 |
| JP | 2008 254044 | 10/2008 |

OTHER PUBLICATIONS

Written Opinion issued Feb. 21, 2012 in PCT/JP2011/076255 filed Nov. 15, 2011 (with English translation).
International Search Report issued Feb. 21, 2012 in PCT/JP11/76255 Filed Nov. 15, 2011.
Extended European Search Report issued Feb. 25, 2015 in Patent Application No. 11870510.2.
Combined Office Action and Search Report issued Feb. 4, 2015 in Chinese Patent Application No. 201180033016.7 (with English translation and English translation of category).
Chinese Office Action issued Jul. 21, 2015 in Patent Application No. 201180033016.7 (with Partial English Translation).
Office Action issued Dec. 15, 2015, in Japan Patent Application No. 2013-501466 (with English language translation), 12 pgs.

* cited by examiner

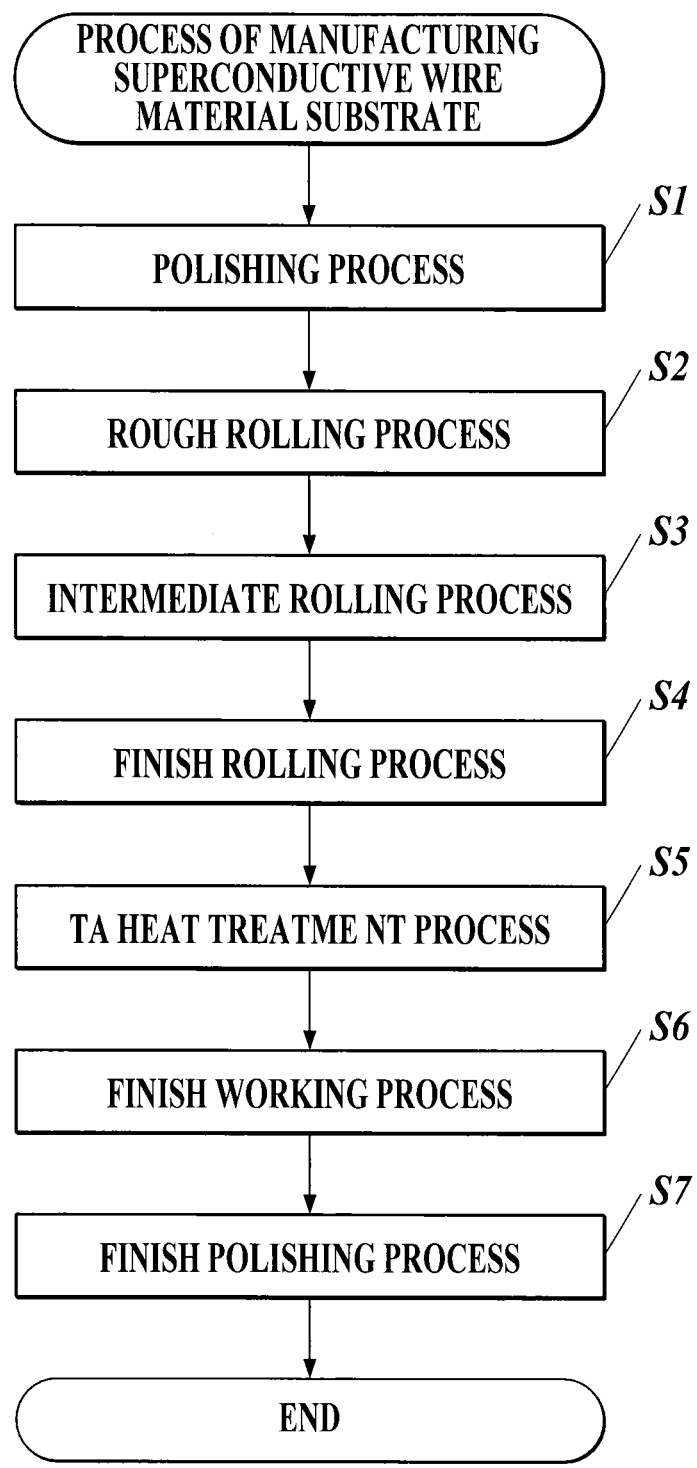

SUPERCONDUCTIVE WIRE MATERIAL SUBSTRATE, MANUFACTURING METHOD THEREOF AND SUPERCONDUCTIVE WIRE MATERIAL

TECHNICAL FIELD

The present invention relates to a superconductive wire material substrate, manufacturing method thereof and superconductive wire material.

BACKGROUND ART

Conventionally, a superconductive (superconducting) wire material configured such that an intermediate layer is formed on a tape-like substrate made of hastelloy by an ion beam assisted deposition (IBAD) method and an oxide superconducting layer is formed and oriented on the intermediate layer has been known (for example, see Patent Document 1). Also, a superconductive wire material configured such that an epitaxially-grown intermediate layer is formed on a bi-axially oriented substrate and an oxide superconducting layer is formed and oriented on the intermediate layer has been known (for example, see Patent Document 2).

Note that a metal substrate used as a superconductive wire material is called a "superconductive wire material substrate". Also, a superconductive wire material substrate, on which an intermediate layer is formed by the IBAD method, is typically called an "IBAD substrate".

A surface of the superconductive wire material substrate goes through each process such as a cold rolling process and a high-precision polishing process, and is processed into a finished surface having a surface roughness Ra of a few nm order (for example, see Patent Documents 3 to 9).

The "surface roughness Ra" is an arithmetic average roughness defined by JISB-0601-2001 (based on ISO4287: 1997).

CITATION LIST

Patent Documents

Patent Document 1: Japanese Patent Application Laid-Open No. H4-329867
Patent Document 2: Japanese Patent Application Laid-Open No. 2007-311234
Patent Document 3: Japanese Patent Application Laid-Open No. 2008-200773
Patent Document 4: Japanese Patent Application Laid-Open No. 2008-200775
Patent Document 5: Japanese Patent Application Laid-Open No. 2007-200870
Patent Document 6: Japanese Patent Application Laid-Open No. 2008-254044
Patent Document 7: Japanese Patent Application Laid-Open No. H4-110454
Patent Document 8: Japanese Patent Application Laid-Open No. 2008-49451
Patent Document 9: Japanese Patent Application Laid-Open No. 2008-36724

SUMMARY OF THE INVENTION

Problem to be Solved by the Invention

Here, to manufacture a superconductive wire having high superconductivity using an IBAD substrate, the IBAD substrate is required to have high crystalline orientation and to have epitaxial growth of an oxide layer such as $CeO_2$ as an intermediate layer. At this time, if defects exist in places on a surface layer of the substrate or distribution fluctuations of the surface roughness exist in places, the crystal growth up to a superconducting layer is jeopardized and local defects occur in places, and therefore, a problem of reducing critical current value property may be caused. A similar problem may be caused for a superconductive wire using an intermediate layer that is epitaxially grown on a bi-axially oriented substrate. Therefore, to obtain a superconductive wire having the high superconductivity, it is necessary to reform a rolled surface of the substrate into a high-performance rolled surface having the surface roughness Ra of a few nm to 1 nm or less by means of mechanical polishing, chemical polishing, and the like. However, in a case where back side surface roughness Ra of the substrate is about a few nm that is equivalent to the surface roughness Ra, and when an intermediate layer is formed on the surface of the substrate, a back surface of the substrate and a susceptor are easily damaged at the time of contacting, and therefore, it is not favorable for manufacturing a long substrate.

In the above-described Patent Documents 3 to 9, the front side surface roughness Ra of the substrate is controlled. However, the back side surface roughness Ra is not controlled, and no description is disclosed regarding the back side surface roughness Ra of the substrate used at the time of forming an intermediate layer.

An object of the present invention is to provide a high-performance long superconductive wire material substrate, a method of manufacturing a high-performance long superconductive wire material substrate, and a superconductive wire material using a high-performance superconductive wire material substrate.

Means to Solve the Problem

According to the present invention, there is provided a superconductive wire material substrate in which, between surface roughnesses Ra of both surfaces (sides) of the superconductive wire material substrate, a surface roughness Ra of one surface (side) of the superconductive wire material substrate is 10 nm or less, and a surface roughness Ra of the other surface (side) of the superconductive wire material substrate is larger than the surface roughness Ra of the one surface and is 8 nm or more and less than 15 nm.

At this time, if the surface roughness of the one surface exceeds 10 nm, an orientation of an intermediate layer formed on the one surface of the substrate is reduced, and therefore, it is not favorable. Also, in a case where the surface roughness Ra of the other surface is less than 8 nm, and when the intermediate layer is then formed on the one surface of the substrate, the back surface of the substrate and the susceptor are easily damaged at the time of contacting, and therefore, it is not favorable. Further, in a case where the surface roughness Ra of the other surface is 15 nm or more, a rougher back side surface layer of the substrate may damage a front side surface layer when the substrate is wound around a reel, and therefore, it is not favorable.

Further, according to the present invention, there is provided a method of manufacturing a superconductive wire material substrate. The method includes a step of cold-rolling of a metal body and a step of heat-treating of the cold-rolled metal body, in which the step of cold-rolling uses an upper and lower pair of rolling rolls having different surface roughnesses Ra.

Further, according to the present invention, there is provided a superconductive wire material. The superconductive wire material includes a superconductive wire material substrate, between two surface roughnesses Ra of both surfaces of the superconductive wire material substrate, having a surface roughness Ra of one surface of 10 nm or less and a surface roughness Ra of the other surface larger than the one surface roughness Ra and of 8 nm or more and less than 15 nm, an intermediate layer formed on the one surface of the superconductive wire material substrate, and a superconducting layer formed on the intermediate layer.

Effects of the Invention

According to the invention, a high-performance long superconductive wire material substrate, a method of manufacturing the high-performance long superconductive wire material substrate, and a superconductive wire material using the high-performance superconductive wire material substrate can be provided.

BRIEF DESCRIPTION OF DRAWINGS

FIG. 2 is a flow diagram illustrating a process of manufacturing a superconductive wire material substrate.

PREFERRED EMBODIMENT TO CARRY OUT THE INVENTION

Figure 1:
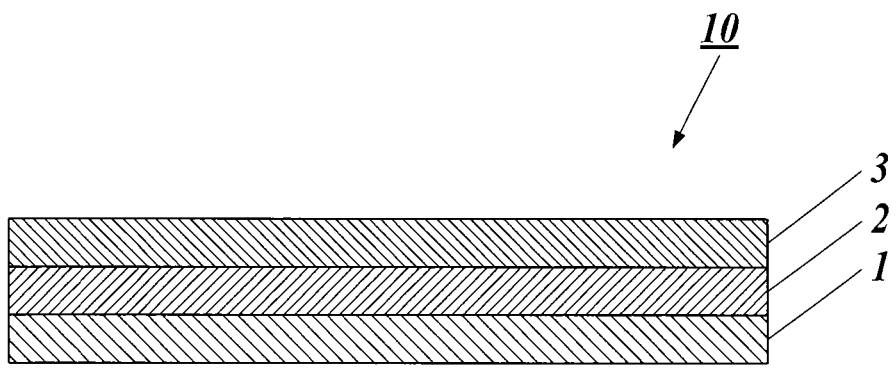
FIG. 1 is a schematic cross-sectional view of a superconductive wire material substrate.

A superconductive wire material substrate, a method of manufacturing a superconductive wire material substrate, and a superconductive wire material according to the present embodiment will be described in detail with reference to the drawings. Note that the present embodiment is an example and the present invention is not limited to the embodiment.

FIG. 1 illustrates a schematic cross-sectional view of a superconductive wire material 10.

The superconductive wire material 10 is configured of a superconductive wire material substrate 1, an intermediate layer 2, and a superconducting layer 3. Also, the superconductive wire material 10 has the intermediate layer 2 and the superconducting layer 3 layered in this order on the superconductive wire material substrate 1.

As a material for the superconductive wire material substrate 1, an Ni-based alloy such as hastelloy (registered trademark) and inconel (registered trademark), and a Fe-based alloy such as stainless steel can be used, and a bright anneal (BA) material subjected to a bright annealing process is favorable.

A process of manufacturing the superconductive wire material substrate 1 will be described with reference to FIG. 2.

First, a metal body to serve as the superconductive wire material substrate 1 is polished (step S1).

As a polishing method, a mechanical polishing, a chemical polishing, an electrolytic polishing, or a polishing combining thereof is employed. Note that such a kind of polishing is not necessarily performed and the process may proceed to step S2 without performing the polishing.

In the mechanical polishing, diamond particles, oxide particles, and the like are used for abrasive particles. Also, as an abrasive liquid, any one of the following is used: water, a surface active agent, oil, an organic solvent, a mixture thereof, a solution of a mixture of water and an acid such as formic acid, acetic acid, nitric acid, and the like, and a solution of a mixture of water and an alkali such as sodium hydroxide. Note that, as the abrasive particles, aluminum oxide, cerium oxides, zirconium oxide, iron oxide, and the like are especially favorable, and as the abrasive liquid, soap suds are especially favorable.

In the chemical polishing, a chemical solution that chemically reacts with a surface of the superconductive wire material substrate 1 is used as the abrasive liquid. Examples of the chemical solution include a liquid such as nitric acid, sulfuric acid, formic acid, acetic acid, chlorine, fluorine, chrome hydrogen peroxide, oxalic acid, tetraphosphate, glacial acetic acid, and a liquid mixture thereof. As the abrasive liquid, a solution which is a mixture of these liquid mixtures with an accelerant such as saturated alcohol and sulfonic acid is especially desired.

In the chemical mechanical polishing, abrasive particles similar to those used in the above-described mechanical polishing are used as the abrasive particles. Also, the abrasive liquid used in the above-described chemical polishing is used as the abrasive liquid.

In the electrolytic polishing, the superconductive wire material substrate 1 is immersed in an electrolytic solution, and the superconductive wire material substrate 1 is energized as an anode and a surface of the substrate is polished with an electrolytic reaction. The electrolytic solution can be an acid or an alkali, and especially, nitric acid, phosphoric acid, chromic acid, hydrogen peroxide, potassium hydroxide, potassium cyanide, and the like are desirable.

Next, the polished metal body is cold rolled (steps S2 to S4).

In a rolling process, each rolling process of a rough rolling (step S2), an intermediate rolling (step S3), and a finish rolling (step S4) is performed. In the rolling process, the cold rolling is performed with a rolling reduction ratio in a range of 40 to 99%. Also, the rolling with rolling rolls having the same surface roughness Ra and the rolling with rolling rolls having different surface roughnesses Ra are respectively performed at least one time for each rolling. Details of each of the rolling processes will be described below (see samples 1-1 to 1-4).

Next, the cold-rolled metal body is subjected to heat treatment (step S5).

Tension anneal (TA) heat treatment for recovering flatness is performed under a tension-applied-condition such that the superconductive wire material substrate is held for 10 seconds or more at the temperature of 850° C. or less under a mixed gas atmosphere of argon gas and hydrogen of 0.5 to 5 vol. %.

Next, the heat-treated metal body is finish-worked (step S6).

In the finish working, the metal body is slit-processed to a desired size.

Finally, the finish-worked metal body is subjected to finish polishing (step S7).

The finish polishing is performed by a mechanical polishing, a chemical polishing, an electrolytic polishing, or a combination polishing thereof described in step S1.

Note that step S7 is not necessarily required, and if the surface roughness Ra of the substrate 1 at the time of step S5 achieves a desired value, the process may be terminated at step S6.

[Sample 1-1]
[Process of Manufacturing Superconductive Wire Material Substrate]

As a sample 1-1, a process of manufacturing the superconductive wire material substrate 1 will be described, which is characterized by using rolling rolls having different surface roughnesses Ra in the finish rolling process (see step S4).

To manufacture the superconductive wire material substrate 1, a BA material (hastelloy C-276) having the surface roughness Ra of 50 nm, a thickness of 0.3 mm, a width of 75 mm, and a depth of 350 m was used. Note that not only hastelloy but also inconel or stainless steal may be used for the material.

In the polishing process (see step S1), the BA material is polished and the surface roughness Ra was made from 50 nm to be about 30 nm.

In the rough rolling process and the intermediate rolling process (see steps S2 and S3), the BA material was rolled using 12-stage rolling rolls having the roll diameter of 20 mm and the same upper and lower surface roughnesses Ra, and an intermediate rolled material having a thickness of 0.15 mm, a width of 75 mm, and a depth of 690 m was manufactured. The surface roughness Ra of the rolling rolls used at the rough rolling was 66 nm, and the surface roughness Ra of the rolling rolls used at the intermediate rolling was 40 nm.

Further, the intermediate rolled material having the thickness of 0.15 mm was rolled into a thickness of 0.107 mm using the rolling rolls having the upper and lower surface roughnesses Ra of 7 nm. The surface roughness Ra of the intermediate rolled material at that time was 7 to 9 nm.

In the finish rolling process (see step S4), the intermediate rolled material having the surface roughness Ra of 7 to 9 nm was rolled into a long rolled material using a rolling roll having the surface roughness Ra of 3 nm and a rolling roll having the surface roughness Ra of 10 nm. The rolling roll having the surface roughness Ra of 3 nm was used as an upper side (front side) rolling roll and the rolling roll having the surface roughness Ra of 10 nm was used as a lower side (back side) rolling roll.

The roll surface roughness used in rolling was obtained with JIS B 0651-2001 stylus surface roughness measurement.

Note that the surface roughness Ra of the lower side rolling roll is desirably at most about 10 nm. If the surface roughness Ra is larger than 10 nm, the surface roughness Ra of the long rolled material in a longitudinal direction may exceed 15 nm. Also, a rubbed scratch caused by rubbing between front and back of the long rolled material wound in a coil-form manner occurs on a surface layer of a highly shiny side (surface), and a surface defect will remain.

Also, in a case where the surface roughness Ra of the upper side rolling roll is 3 nm, and a difference between the surface roughness Ra of the upper side rolling roll and that of the lower side rolling roll is less than 3 nm, an influence of material slipping at the time of rolling becomes large and shape control becomes difficult.

Also, the upper side rolling roll may have the surface roughness Ra of 3 nm either across the entire width or in a limited width slightly narrower than the width of the intermediate rolled material. In the latter case, the surface roughnesses Ra of end portions of the upper side and the lower side rolling rolls may be about 10 nm.

In the TA heat treatment process (see step S5), to improve the flatness of the long rolled material, a tension of 5 kgf/mm$^2$ was applied to the long rolled material under the conditions of 790° C. for 20 seconds and a mixed gas atmosphere of argon gas and hydrogen.

In the finish working process (see step S6), the long rolled material was slit-processed to a desired finish size, and six superconductive wire material substrates 1 having 0.10 mm in thickness, 10 mm in width, and 1030 m in depth were manufactured. The reduction ratio in the rolling process was ensured in 60% or more.

Samples were collected from both end portions of the superconductive wire material substrate 1, and the surface roughnesses Ra in 10 μm squares were measured with an atomic force microscope (AFM). As a result of the measurement, ten-point averages of the surface roughnesses Ra of the both end portions of the front side surface were 3.2 nm and 3.8 nm, respectively, and the surface roughnesses Ra of all of the measurement points were Ra<4 nm. Also, the ten-point averages of the surface roughnesses Ra of the both end portions of the back side surface were 10.2 nm and 10.6 nm, respectively.

A tension test of 0.2% proof stress, at room temperature with respect to the superconductive wire material substrate 1 after the finish working process, was 1.6 GPa.

As described above, according to the method of manufacturing sample 1-1, a high-strength and high-performance superconductive wire material substrate 1 can be manufactured.

[Sample 2-1]

In the finish polishing process (see step S7), the front side surface of the superconductive wire material substrate 1 obtained from sample 1-1 after the finish working process was mechanical-polished, and the surface roughness Ra was made to be 0.9 nm. Note that the polishing method may be any one of a mechanical polishing, a chemical polishing, and an electrolytic polishing. Since the surface layer of the superconductive wire material substrate 1 just before the finish polishing process has uniform quality, a polishing cost of the finish polishing process can be reduced.

[Process of Manufacturing Superconductive Wire Material]

The intermediate layer 2 was formed using the IBAD method on the front side surface of the superconductive wire material substrate 1 manufactured as sample 2-1. The intermediate layer 2 is configured such that a Gd—Zr oxide intermediate layer (GZO) of about 1 μm is formed on the superconductive wire material substrate 1, and a $CeO_2$ oxide intermediate layer having the thickness of about 450 nm is further formed thereon with a PLD.

The superconducting layer 3 was formed on the intermediate layer 2 using the pulsed laser deposition method. The superconducting layer 3 is configured by depositing about 1 μm of an YBCO superconductor on the intermediate layer 2.

Further, silver of the thickness of about 10 μm was vapor-deposited on the superconducting layer 3 using a high frequency sputtering device to form a protective layer. Further, oxygen annealing was performed at the temperature of 550° C. in a flow of oxygen, and the superconductive wire material 10 was manufactured. A stabilizing layer containing copper is formed on a surface layer of the superconductive wire material 10.

Critical current of the manufactured superconductive wire material 10 was measured using a four-terminal method with 200 m of the manufactured superconductive wire material 10 being immersed in liquid nitrogen. The measurement was performed by 1 m pitch and a voltage terminal was 1.2 m. The conductivity characteristics of the superconductive wire material 10 in definition of 1 μV/cm was 307 A or more at all of measurement positions of the critical current value, and a minimum/maximum difference resulted in 8 A.

[Sample 1-2]

[Process of Manufacturing Superconductive Wire Material Substrate]

As a sample 1-2, a process of manufacturing the superconductive wire material substrate 1 will be described, which is characterized by using rolling rolls having different surface roughnesses Ra in the intermediate rolling process and the finish rolling process (see steps S3 and S4).

To manufacture the superconductive wire material substrate 1, a BA material (hastelloy C-276) having the surface roughness Ra of 50 nm, a thickness of 0.3 mm, a width of 75 mm, and a depth of 350 m was used. Note that not only hastelloy but also inconel or stainless steel may be used.

In the polishing process (see step S1), the BA material is polished and the surface roughness Ra was made from 50 nm to be about 30 nm.

In the rough rolling process (see step S2), the BA material was rolled using 12-stage rolling rolls having the roll diameter of 20 mm and the same upper and lower surface roughnesses Ra (45 nm), and a rough rolled material having a thickness of 0.15 mm, a width of 75 mm, and a depth of 690 m was manufactured. The surface roughness Ra of the rough rolled material at this time was made to be about 15 to 25 nm.

In the intermediate rolling process (see step S3), the rough rolled material was rolled using a rolling roll having the surface roughness Ra of 6 nm and a rolling roll having the surface roughness Ra of 10 nm, and an intermediate rolled material having a thickness of 0.107 mm, a width of 75 mm, and a depth of 960 m was manufactured. The rolling roll having the surface roughness Ra of 6 nm was used as an upper side rolling roll and the rolling roll having the surface roughness Ra of 10 nm was used as a lower side rolling roll.

In the finish rolling process (see step S4), the intermediate rolled material was rolled using a rolling roll having the surface roughness Ra of 3 nm and a rolling roll having the surface roughness Ra of 9 nm, and a long rolled material was manufactured. The rolling roll having the surface roughness Ra of 3 nm was used as an upper side rolling roll and the rolling roll having the surface roughness Ra of 9 nm was used as a lower side rolling roll.

Note that the surface roughness Ra of the lower side rolling roll is desirably at most about 10 nm. If the surface roughness Ra is larger than 10 nm, the surface roughness Ra of the long rolled material in a longitudinal direction may exceed 15 nm. Also, in a case where the surface roughness Ra of a back surface (a surface having a larger surface roughness Ra) of the long rolled material exceeds 30 nm, a rubbed scratch caused by rubbing between front and back of the long rolled material wound in a coil-form manner occurs on a surface layer of a highly shiny side, and a surface defect will remain.

Also, in a case where the surface roughness Ra of the upper side rolling roll is 3 nm, and a difference between the surface roughness Ra of the upper side rolling roll and that of the lower side rolling roll is less than 3 nm, the influence of material slipping at the time of rolling becomes large and the shape control becomes difficult.

In the TA heat treatment process (see step S5), to improve the flatness of the long rolled material, a tension of 5 kgf/mm$^2$ was applied to the long rolled material under the conditions of 790° C. for 20 seconds and a mixed gas atmosphere of argon gas and hydrogen.

In the finish working process (see step S6), the long rolled material was slit-processed to a desired finish size, and six superconductive wire material substrates 1 having 0.10 mm in thickness, 10 mm in width, and 1020 m in depth were manufactured. The reduction ratio in the rolling process was ensured in 60% or more.

Samples were collected from both end portions of the superconductive wire material substrate 1, and the surface roughnesses Ra in 10 μm squares were measured with the atomic force microscope (AFM). As a result of the measurement, the ten-point averages of the surface roughnesses Ra of the both end portions of the front side surface were 3.0 nm and 3.5 nm, respectively, and the surface roughnesses Ra of all of the measurement points were Ra<4 nm. Also, the ten-point averages of the surface roughness Ra of the both end portions of the back side surface were 8.8 nm and 9.5 nm, respectively.

A tension test of 0.2% proof stress, at room temperature with respect to the superconductive wire material substrate 1 after the finish working process, was 1.5 GPa.

As described above, according to the method of manufacturing sample 1-2, a high-strength and high-performance superconductive wire material substrate 1 can be manufactured.

[Sample 2-2]

In the finish polishing process (see step S7), the front side surface of the superconductive wire material substrate 1 obtained from sample 1-2 after the finish working process was mechanical-polished, and the surface roughness Ra was made to be 0.8 nm. Note that the polishing method may be any one of a mechanical polishing, a chemical polishing, and an electrolytic polishing. Also, since the surface layer of the superconductive wire material substrate 1 just before the finish polishing process is uniform, the polishing cost can be reduced.

[Process of Manufacturing Superconductive Wire Material]

The intermediate layer 2 was formed using the IBAD on the front side surface of the superconductive wire material substrate 1 manufactured as sample 2-2. The intermediate layer 2 is configured such that a Gd—Zr oxide intermediate layer (GZO) of about 1 μm is formed on the superconductive wire material substrate 1, and a CeO$_2$ oxide intermediate layer having the thickness of about 500 nm is further formed thereon with the PLD.

The superconducting layer 3 was formed on the intermediate layer 2 using the pulsed laser deposition method. The superconducting layer 3 is configured by depositing about 1 μm of an YBCO superconductor on the intermediate layer 2.

Further, silver of the thickness of about 10 μm was vapor-deposited on the superconducting layer 3 using the high frequency sputtering device to form a protective layer. Further, the oxygen annealing was performed at the temperature of 550° C. in a flow of oxygen, and the superconductive wire material 10 was manufactured. A stabilizing layer containing copper is formed on the surface layer of the superconductive wire material 10.

The critical current of the manufactured superconductive wire material 10 was measured using the four-terminal method with 200 m of the manufactured superconductive wire material 10 being immersed in liquid nitrogen. The measurement was performed by 1 m pitch and the voltage terminal was 1.2 m. The conductivity characteristics of the superconductive wire material 10 in definition of 1 μV/cm was 326 A or more at all of measurement positions of the critical current value, and a minimum/maximum difference resulted in 9 A.

[Sample 1-3]

[Process of Manufacturing Superconductive Wire Material Substrate]

As a sample 1-3, a process of manufacturing the superconductive wire material substrate 1 will be described, which is characterized by using rolling rolls having different surface roughnesses Ra in the intermediate rolling process and the finish rolling process (see steps S3 and S4).

To manufacture the superconductive wire material substrate 1, a BA material (hastelloy C-276) having the surface roughness Ra of 50 nm, a thickness of 0.3 mm, a width of 75 mm, and a depth of 350 m was used. Note that not only hastelloy but also inconel and stainless steel may be used.

In the polishing process (see step S1), the BA material was polished and the surface roughness Ra was made from 50 nm to be about 30 nm.

In the rough rolling process (see step S2), the BA material was rolled using 12-stage rolling rolls having the roll diameter of 20 mm and the same upper and lower surface roughnesses Ra (45 nm), and a rough rolled material having a thickness of 0.15 mm, a width of 75 mm, and a depth of 690 m was manufactured. The surface roughness Ra of the rough rolled material at this time was made to be about 15 to 25 nm.

In the intermediate rolling process (see step S3), the rough rolled material was rolled using a rolling roll having the surface roughness Ra of 6 nm and a rolling roll having the surface roughness Ra of 12 nm, and an intermediate rolled material having a thickness of 0.107 mm, a width of 75 mm, and a depth of 960 m was manufactured. The rolling roll having the surface roughness Ra of 6 nm was used as an upper side rolling roll and the rolling roll having the surface roughness Ra of 12 nm was used as a lower side rolling roll.

In the finish rolling process (see step S4), the intermediate rolled material was rolled using a rolling roll having the surface roughness Ra of 4 nm and a rolling roll having the surface roughness Ra of 9 nm, and a long rolled material was manufactured. The rolling roll having the surface roughness Ra of 4 nm was used as an upper side rolling roll and the rolling roll having the surface roughness Ra of 9 nm was used as a lower side rolling roll.

In the TA heat treatment process (see step S5), to improve the flatness of the long rolled material, a tension of 5 kgf/mm$^2$ was applied to the long rolled material under the conditions of 790° C. for 20 seconds and a mixed gas atmosphere of argon gas and hydrogen.

In the finish working process (see step S6), the long rolled material was slit-processed to a desired finish size, and six superconductive wire material substrates 1 having 0.10 mm in thickness, 10 mm in width, and 1020 m in depth were manufactured. The reduction ratio in the rolling process was ensured in 60% or more.

Samples were collected from both end portions of the superconductive wire material substrate 1, and the surface roughnesses Ra in 10 μm squares were measured with the atomic force microscope (AFM). As a result of the measurement, the ten-point averages of the surface roughnesses Ra of the both end portions of the front side surface were 4.1 nm and 4.3 nm, respectively, and the surface roughnesses Ra of all of the measurement points were Ra<5 nm. Also, the ten-point averages of the surface roughnesses Ra of the both end portions of the back side surface were 9.7 nm and 8.9 nm, respectively.

A tension test of 0.2% proof stress, at room temperature with respect to the superconductive wire material substrate 1 after the finish working process, was 1.6 GPa.

As described above, according to the method of manufacturing sample 1-3, a high-strength and high-performance superconductive wire material substrate 1 can be manufactured.

[Sample 2-3]

In the finish polishing process (see step S7), the front side surface of the superconductive wire material substrate 1 obtained from sample 1-3 after the finish working process was mechanical-polished, and the surface roughness Ra was made to be 1.2 nm. Note that the polishing method may be any one of a mechanical polishing, a chemical polishing, and an electrolytic polishing. Since the surface layer of the superconductive wire material substrate 1 just before the finish polishing process is uniform, the polishing cost can be reduced.

[Process of Manufacturing Superconductive Wire Material]

The intermediate layer 2 was formed using the IBAD method on the superconductive wire material substrate 1 manufactured in sample 2-3. The intermediate layer 2 is configured such that a Gd—Zr oxide intermediate layer (GZO) of about 1 μm is formed on the superconductive wire material substrate 1, and a $CeO_2$ oxide intermediate layer having the thickness of about 500 nm is further formed thereon with the PLD.

The superconducting layer 3 was formed on the intermediate layer 2 using the pulsed laser deposition method. The superconducting layer 3 is configured by depositing about 1 μm of an YBCO superconductor on the intermediate layer 2.

Further, silver of the thickness of about 10 μm was vapor-deposited on the superconducting layer 3 using the high frequency sputtering device to form a protective layer. Further, the oxygen annealing was performed at the temperature of 550° C. in a flow of oxygen, and the superconductive wire material 10 was manufactured. A stabilizing layer having copper is formed on the surface layer of the superconductive wire material 10.

The critical current of the manufactured superconductive wire material 10 was measured using the four-terminal method with 200 m of the manufactured superconductive wire material 10 being immersed in liquid nitrogen. The measurement was performed by 1 m pitch and the voltage terminal was 1.2 m. The conductivity characteristics of the superconductive wire material 10 in definition of 1 μV/cm was 295 A or more at all of measurement positions of the critical current value, and a minimum/maximum difference resulted in 8 A.

[Sample 1-4 (2-4)]

[Process of Manufacturing Superconductive Wire Material Substrate]

As a sample 1-4 (2-4), a process of manufacturing the superconductive wire material substrate 1 will be described, which is characterized by using rolling rolls having different surface roughnesses Ra in the finish rolling process (see step S4) and by not performing the finish polishing process.

To manufacture the superconductive wire material substrate 1, a BA material (hastelloy C-276) having the surface roughness Ra of 50 nm, a thickness of 0.3 mm, a width of 75 mm, and a depth of 350 m was used. Note that not only hastelloy but also inconel or stainless steel may be used.

In the polishing process (see step S1), the BA material was polished and the surface roughness Ra was made from 50 nm to be about 30 nm.

In the rough rolling process and the intermediate rolling process (see steps S2 and S3), the BA material was rolled using 12-stage rolling rolls having the roll diameter of 20 mm and the same upper and lower surface roughnesses Ra, and an intermediate rolled material having a thickness of 0.15 mm, a width of 75 mm, and a depth of 690 m was manufactured The surface roughness Ra of the rolling rolls used at the rough rolling was 66 nm, and the surface roughness Ra of the rolling roll used at the intermediate rolling was 40 nm.

Further, the intermediate rolled material having the thickness of 0.15 mm was rolled into a thickness of 0.107 mm using rolling rolls having the upper and lower surface roughnesses Ra of 7 nm. The surface roughness Ra of the intermediate rolled material at this time was 7 to 9 nm.

In the finish rolling process (see step S4), the intermediate rolled material having the surface roughness Ra of 7 to 9 nm was rolled using a rolling roll having the surface roughness Ra of 2 nm and a rolling roll having the surface roughness Ra of 10 nm, and a long rolled material was manufactured. The rolling roll having the surface roughness Ra of 2 nm was used as an upper side rolling roll and the rolling roll having the surface roughness Ra of 10 nm was used as a lower side rolling roll.

Note that the surface roughness Ra of the lower side rolling roll is desirably at most about 10 nm. If the surface roughness Ra is larger than 10 nm, the surface roughness Ra of the long rolled material in a longitudinal direction may exceed 15 nm. Also, a rubbed scratch caused by rubbing between front and back of the long rolled material wound in a coil-form manner occurs on a surface layer of a highly shiny side, and a surface defect will remain.

Also, in a case where the surface roughness Ra of the upper side rolling roll is 3 nm and a difference between the surface roughness Ra of the upper side rolling roll and that of the lower side rolling roll is less than 3 nm, an influence of material slipping at the time of rolling becomes large and the shape control becomes difficult.

Also, the upper side rolling roll may have the surface roughness Ra of 3 nm either across the entire width or in a limited width slightly narrower than the width of the intermediate rolled material. In the latter case, the surface roughnesses Ra of end portions of the upper side and the lower side rolling rolls may be about 10 nm.

In the TA heat treatment process (see step S5), to improve the flatness of the long rolled material, a tension of 5 kgf/mm$^2$ was applied to the long rolled material under the conditions of 790° C. for 20 seconds and a mixed gas atmosphere of argon gas and hydrogen.

In the finish working process (see step S6), the long rolled material was slit-processed to a desired finish size, and six superconductive wire material substrates 1 having 0.10 mm in thickness, 10 mm in width, and 1030 m in depth were manufactured. The reduction ratio in the rolling process was ensured in 60% or more.

Samples were collected from both end portions of the superconductive wire material substrate 1, and the surface roughnesses Ra in 10 μm squares were measured with the atomic force microscope (AFM). As a result of the measurement, the ten-point averages of the surface roughnesses Ra of the both end portions of the front side surface were 2.4 nm and 2.8 nm, respectively, and the surface roughnesses Ra of all of the measurement points were Ra<3 nm. Also, the ten-point averages of the surface roughnesses Ra of the both end portions of the back side surface were 9.8 nm and 10.8 nm, respectively.

The finish polishing process (see step S7) was omitted. The cost can be considerably reduced by omitting the finish polishing process.

A tension test of 0.2% proof stress, at room temperature with respect to the superconductive wire material substrate 1 after the finish working process, was 1.5 GPa.

As described above, according to the method of manufacturing sample 1-4, a high-strength, high-performance, and less-expensive superconductive wire material substrate 1 can be manufactured.

[Process of Manufacturing Superconductive Wire Material]

The intermediate layer 2 was formed using the IBAD method on the front side surface of the superconductive wire material substrate 1 manufactured in sample 1-4 (2-4). The intermediate layer 2 is configured such that a Gd—Zr oxide intermediate layer (GZO) of about 1 μm is formed on the superconductive wire material substrate 1, and a $CeO_2$ oxide intermediate layer having the thickness of about 480 nm is further formed thereon with the PLD.

The superconducting layer 3 was formed on the intermediate layer 2 using the pulsed laser deposition method. The superconducting layer 3 is configured by depositing about 1 μm of an YBCO superconductor on the intermediate layer 2.

Further, silver of the thickness of about 10 μm was vapor-deposited on the superconducting layer 3 using the high frequency sputtering device to form a protective layer. Further, the oxygen annealing was performed at the temperature of 550° C. in a flow of oxygen so as to complete the superconductive wire material 10. Note that a stabilizing layer containing copper is formed on the surface layer of the superconductive wire material 10.

The critical current of the manufactured superconductive wire material 10 was measured using the four-terminal method with 200 m of the manufactured superconductive wire material 10 being immersed in liquid nitrogen. The measurement was performed by 1 m pitch and the voltage terminal was 1.2 m. The conductivity characteristics of the superconductive wire material 10 in definition of 1 μV/cm was 261 A or more at all of measurement positions of the critical current value, and a minimum/maximum difference resulted in 12 A.

[Sample 1-5]
[Process of Manufacturing Superconductive Wire Material Substrate]

As a sample 1-5, a process of manufacturing the superconductive wire material substrate 1 will be described, which is characterized by using rolling rolls having different surface roughnesses Ra in the finish rolling process (see step S4).

To manufacture the superconductive wire material substrate, a BA material (hastelloy C-276) having a surface roughness Ra of 50 nm, a thickness of 0.3 mm, a width of 75 mm, and a depth of 350 m was used.

In the polishing process (see step S1), the BA material was polished and the surface roughness Ra was made from 50 nm to be about 30 nm.

In the rough rolling process and the intermediate rolling process (see steps S2 and S3), the BA material was rolled using 12-stage rolling rolls having the roll diameter of 20 mm and the same upper and lower surface roughnesses Ra, and an intermediate rolled material having a thickness of 0.107 mm, a width of 75 mm, and a depth of 970 m was manufactured. The surface roughness Ra of the rolling rolls used at the rough rolling was 40 nm, and the surface roughness Ra of the rolling rolls used at the intermediate rolling was 13 nm.

In the finish rolling process (see step S4), the intermediate rolled material was rolled using a rolling roll having the surface roughness Ra of 3 nm and a rolling roll having the surface roughness Ra of 13 nm, and a long rolled material was manufactured. The rolling roll having the surface roughness Ra of 3 nm was used as an upper side rolling roll and the rolling roll having the surface roughness Ra of 13 nm was used as a lower side rolling roll.

In the TA heat treatment process (see step S5), to improve the flatness of the long rolled material, a tension of 5 kgf/mm$^2$ was applied to the hastelloy under the conditions of 790° C. for 20 seconds and a mixed gas atmosphere of argon gas and hydrogen.

In the finish working process (see step S6), the long rolled material was slit-processed to a desired finish size, and six superconductive wire material substrates 1 having a thickness of 0.10 mm, a width of 10 mm, and a depth of 1030 m were manufactured. 60% or more of the reduction ratio was ensured in the rolling process.

Samples were collected from both end portions of the superconductive wire material substrate 1, and the surface roughnesses Ra in 10 μm squares were measured with the atomic force microscope (AFM). As a result of the measurement, the ten-point averages of the surface roughnesses Ra of the both end portions of the front side surface were 3.7 nm and 3.9 nm, respectively, and the ten-point averages of the surface roughnesses Ra of the both end portions of the back side surface were 13.3 nm and 13.6 nm, respectively.

A tension test of 0.2% proof stress, at room temperature with respect to the superconductive wire material substrate 1 after the finish working process, was 1.6 GPa.

[Sample 2-5]

In the finish polishing process (see step S7), the front side surface of the superconductive wire material substrate 1 obtained from sample 1-5 after the finish working process was mechanical-polished, and the surface roughness Ra was made to be 2.4 nm. Note that the polishing method may be any one of a mechanical polishing, a chemical polishing, and an electrolytic polishing.

[Process of Manufacturing Superconductive Wire Material]

An intermediate layer was formed using the IBAD method on the superconductive wire material substrate manufactured in sample 2-5. The intermediate layer is configured such that a Gd—Zr oxide intermediate layer (GZO) of about 1 µm is formed on the superconductive wire material substrate, and a $CeO_2$ oxide intermediate layer having the thickness of about 480 nm is further formed thereon with the PLD.

A superconducting layer was formed on the intermediate layer using the pulsed laser deposition method. The superconducting layer is configured by depositing about 1 µm of an YBCO superconductor on the intermediate layer.

Further, silver of the thickness of about 10 µm was vapor-deposited on the superconducting layer using the high frequency sputtering device to form a protective layer. Further, the oxygen annealing was performed at the temperature of 550° C. in a flow of oxygen so as to complete the superconductive wire material. Note that a stabilizing layer containing copper is formed on the surface layer of the superconductive wire material 10.

The critical current of the manufactured superconductive wire material 10 was measured using the four-terminal method with 200 m of the manufactured superconductive wire material 10 being immersed in liquid nitrogen. The measurement was performed by 1 m pitch and the voltage terminal was 1.2 m. The conductivity characteristics of the superconductive wire material in definition of 1 µV/cm was 268 A or more at all of measurement positions of the critical current value, and a minimum/maximum difference resulted in 37 A.

[Sample 1-6]

[Process of Manufacturing Superconductive Wire Material Substrate]

As a sample 1-6, a process of manufacturing a superconductive wire material substrate using rolling rolls having the same upper and lower surface roughnesses Ra in all of the rolling processes (see steps S2 to S4) will be described.

To manufacture a superconductive wire material substrate, a BA material (hastelloy C-276) having a surface roughness Ra of 50 nm, a thickness of 0.3 mm, a width of 75 mm, and a depth of 350 m was used.

In the polishing process (see step S1), the BA material was polished and the surface roughness Ra was made from 50 nm to be about 30 nm.

In the rough rolling process and the intermediate rolling process (see steps S2 and S3), the BA material was rolled using 12-stage rolling rolls having the roll diameter of 20 mm and the same upper and lower surface roughnesses Ra, and an intermediate rolled material having a thickness of 0.107 mm, a width of 75 mm, and a depth of 970 m was manufactured. The surface roughness Ra of the rolling rolls used at the rough rolling was 40 nm, and the surface roughness Ra of the rolling rolls used at the intermediate rolling was 13 nm.

In the finish rolling process (see step S4), the intermediate rolled material was rolled using rolling rolls having the same upper and lower surface roughnesses Ra of 7 nm so as to complete a long rolled material.

At this time, the influence of material slipping at the time of rolling became large, and the long rolled material resulted in an end extended shape with poor flatness.

In the TA heat treatment process (see step S5), to improve the flatness of the long rolled material, a tension of 5 kgf/mm² was applied to the hastelloy under the conditions of 790° C. for 20 seconds and a mixed gas atmosphere of argon gas and hydrogen.

In the finish working process (see step S6), the long rolled material was slit-processed to a desired finish size, and six superconductive wire material substrates having a thickness of 100 µm, a width of 10 mm, and a depth of 1030 m were manufactured. 60% or more of the reduction ratio was ensured in the rolling process. Note that two of the six manufactured superconductive wire material substrates had a discontinuous flatness fluctuation, and had unsuitable shape quality for the formation of an intermediate layer.

Samples were collected from both end portions of the superconductive wire material substrate, and the surface roughnesses Ra in 10 µm squares were measured with the atomic force microscope (AFM). As a result of the measurement, the ten-point averages of the surface roughnesses Ra of the both end portions of the front side surface were 7.2 nm and 7.8 nm, respectively, and the ten-point averages of the surface roughnesses Ra of the both end portions of the back side surface were 7.9 nm and 8.2 nm, respectively.

A tension test of 0.2% proof stress, at room temperature with respect to the superconductive wire material substrate 1 after the finish working process, was 1.6 GPa.

[Sample 2-6]

In the finish polishing process (see step S7), the front side surface of the superconductive wire material substrate 1 obtained from sample 1-6 after the finish working process was mechanical-polished, and the surface roughness Ra was made to be 2.9 nm. Note that the polishing method may be any one of a mechanical polishing, a chemical polishing, and an electrolytic polishing.

[Process of Manufacturing Superconductive Wire Material]

An intermediate layer is formed using the IBAD method on the front side surface of the superconductive wire material substrate manufactured in sample 2-6. The intermediate layer is configured such that a Gd—Zr oxide intermediate layer (GZO) of about 1 µm is formed on the superconductive wire material substrate, and a $CeO_2$ oxide intermediate layer having the thickness of about 480 nm is further formed thereon with the PLD.

A superconducting layer was formed on the intermediate layer using the pulsed laser deposition method. The superconducting layer is configured by depositing about 1 µm of an YBCO superconductor on the intermediate layer.

Further, silver of a thickness of about 10 µm was vapor-deposited on the superconducting layer using the high frequency sputtering device to form a protective layer. Further, the oxygen annealing was performed at the temperature of 550° C. in a flow of oxygen so as to complete the superconductive wire material 10. Note that a stabilizing layer containing copper is formed on the surface layer of the superconductive wire material 10.

The critical current of the manufactured superconductive wire material 10 was measured using the four-terminal method with 200 m of the manufactured superconductive wire material 10 being immersed in liquid nitrogen. The measurement was performed by 1 m pitch and the voltage terminal was 1.2 m. The conductivity characteristics of the superconductive wire material in definition of 1 µV/cm was 240 A or more at all of measurement positions of the critical current value, and a minimum/maximum difference resulted in 28 A.

[Samples 1-7 to 1-13]

As samples 1-7 to 1-13, similar to sample 1-1, a process of manufacturing the superconductive wire material substrate 1 was performed, which is characterized by using rolling rolls having different surface roughnesses Ra in the finish rolling process (see step S4). The surface roughnesses Ra of the upper side (front side) and the lower side (back side) rolling rolls in the finish rolling process (step S4) used in each sample were as illustrated in Table 1.

In Table 1, characteristics of the superconductive wire material substrates of the above-described samples 1-1 to 1-13, the surface roughnesses Ra of the upper side (front side) and the lower side (back side) rolling rolls in the finish rolling process, and the front/back surface roughnesses Ra of the substrate after the finish rolling process are shown.

Note that the shape defect percentage in Table 1 indicates a percentage of the substrates having quality that does not comply with the shape (the thickness of 0.1 mm, the width of 10 mm, and the depth of 200 m in a unit) suitable for the formation of the intermediate layer in the manufactured superconductive wire material substrates. The smaller the shape defect percentage is, the more possible to manufacture the long superconductive wire material substrate is.

to sample 1-6, the obtained shape defect percentage of the superconductive wire material substrate was high. This is probably because the upper side surface roughness Ra is too small, and further, the surface roughness Ra of the lower side (back side) rolling roll is low like 7 nm, and therefore, the superconductive wire material substrate was slipped at the time of rolling, and the same phenomenon as sample 1-6 occurred.

Meanwhile, in sample 1-13, the surface roughness Ra of the upper side (front side) rolling roll was 70 nm or more. However, the obtained shape defect percentage of the superconductive wire material substrate was high. This is probably because the rolling was performed on the rough surface having a large surface roughness Ra, ununiform internal stress was distributed in the superconductive wire material substrate and deformation was caused in the obtained superconductive wire material substrate by the following heat treatment process (step S5).

From the above, the rolling roll having a smaller surface roughness Ra between the rolling rolls is required to have the surface roughness Ra of 3 nm or more and less than 70 nm.

Also, like sample 1-12, the rolling roll having the smaller surface roughness Ra between the rolling rolls has the surface roughness Ra of 60 nm or more and the shape defect percentage is reduced compared with the surface roughness Ra of 70 nm of sample 1-13. However, the shape defect percentage cannot be 0%, and therefore, it is favorable that the surface roughness is less than 60 nm.

TABLE 1

| | SAMPLE | 1-1 | 1-2 | 1-3 | 1-4 | 1-5 | 1-6 | 1-7 | 1-8 | 1-9 | 1-10 | 1-11 | 1-12 | 1-13 |
|---|---|---|---|---|---|---|---|---|---|---|---|---|---|---|
| ROLLING ROLL STRUCTURE IN FINISH ROLLING PROCESS | FRONT SIDE SURFACE ROUGHNESS Ra [nm] | 3.0 | 3.0 | 4.0 | 2.0 | 3.0 | 7.0 | 2.0 | 4.0 | 4.0 | 20.0 | 40.0 | 60.0 | 70.0 |
| | BACK SIDE SURFACE ROUGHNESS Ra [nm] | 10.0 | 9.0 | 9.0 | 10.0 | 13.0 | 7.0 | 7.0 | 7.0 | 17.0 | 26.0 | 47.0 | 68.0 | 75.0 |
| SUBSTRATE STRUCTURE (AFTER FINISH ROLLING PROCESS) | FRONT SIDE SURFACE ROUGHNESS Ra [nm] | 3.8 | 3.5 | 4.3 | 2.8 | 3.9 | 7.8 | 2.8 | 4.4 | 4.8 | 22.9 | 44.8 | 68.2 | 78.9 |
| | BACK SIDE SURFACE ROUGHNESS Ra [nm] | 10.6 | 9.5 | 9.7 | 10.8 | 13.6 | 8.2 | 8.6 | 8.1 | 17.7 | 27.8 | 49.5 | 70.1 | 82.4 |
| SUBSTRATE CHARACTERISTIC | SHAPE DEFECT PERCENTAGE | 0% | 0% | 0% | 0% | 0% | 16.6% | 16.6% | 0.0% | 6.6% | 0% | 0% | 16.6% | 23.3% |
| | $\sigma$ 0.2% (PROOF STRESS) | 1.6 GPa | 1.5 GPa | 1.6 GPa | 1.5 GPa | 1.6 GPa | 1.6 GPa | 1.5 GPa | 1.6 GPa | 1.6 GPa | 1.6 GPa | 1.5 GPa | 1.6 GPa | 1.5 GPa |

Samples 1 to 5 and 1-7 to 1-13 correspond to the case where the surface roughnesses Ra of the upper side (front side) and the lower side (back side) rolling rolls in the finish rolling process are different, whilst sample 1-6 corresponds to the case where the surface roughnesses Ra of the upper side and the lower side rolling rolls are the same.

In sample 1-6, the obtained shape defect percentage of the superconductive wire material substrate was high. This is probably because, in sample 1-6, the surface roughnesses Ra of the upper side and the lower side rolling rolls are the same, the superconductive wire material substrate was slipped at the time of rolling, and therefore, the shape flatness discontinuously fluctuated. From this, it can be seen that the surface roughnesses Ra of the upper side (front side) and the lower side (back side) rolling rolls are required to be different from each other.

In sample 1-7, the surface roughness Ra of the upper side (front side) rolling roll was less than 3 nm. However, similar In sample 1-9, the difference between the surface roughness Ra of the upper side (front side) rolling roll and the surface roughness Ra of the lower side (back side) rolling roll is 10 nm or more. When the surface of the obtained superconductive wire material substrate was confirmed, a surface defect that might be a rubbed scratch was formed on the upper side surface layer having the smaller surface roughness Ra. This is probably because, in sample 1-9, compared with the upper side (front side) rolling roll, the lower side (back side) surface roughness Ra is rougher, and when a tape-shaped superconductive wire material substrate was wound around a reel, the rough back side surface layer of the substrate damaged the front side surface layer.

From the above, it is favorable that the upper and lower pair of rolling rolls employ rolling rolls having the surface roughnesses Ra, the difference of which is more than 2 nm and less than 10 nm.

Here, it is desired that the surface roughness Ra of the upper side (front side) substrate is as small as possible, and further, it is also desirable that the surface roughness Ra of the lower side (back side) substrate is not extremely rough. Therefore, like samples 1-1 to 1-5, and 1-8, it is favorable that the surface roughness Ra of the lower side (back side) rolling roll in the finish rolling process is less than 15 nm, and is more favorably 10 nm or less.

Note that in a case where the surface roughness Ra of a rolling-finished substrate and the surface roughness Ra after precision polishing are largely different, Rz, which means the maximum height of the surface of the substrate after polishing, becomes large and it becomes difficult to reduce the suffering of a surface scratch or a rolling scratch in the depth direction. Therefore, it is favorable that the surface roughness Ra of the rolling-finished substrate is a few nm.

[Samples 2-7 to 2-13]

In samples 2-7 to 2-13, the intermediate layer 2 was formed using the IBAD method on the front side surface of the superconductive wire material substrate 1 obtained after the finish working process or the finish polishing process. The intermediate layer 2 is configured such that a Gd—Zr oxide intermediate layer (GZO) of about 1 μm is formed on the superconductive wire material substrate 1, and a $CeO_2$ oxide intermediate layer having the thickness of about 450 nm is further formed thereon with the PLD.

The superconducting layer 3 was formed on the intermediate layer 2 using the pulsed laser deposition method. The superconducting layer 3 is configured by depositing about 1 μm of an YBCO superconductor on the intermediate layer 2. Further, silver of a thickness of about 10 μm was vapor-deposited on the superconducting layer 3 using the high frequency sputtering device to form a protective layer. Further, the oxygen annealing was performed at the temperature of 550° C. in a flow of oxygen so as to complete the superconductive wire material 10. Note that a stabilizing layer containing copper is formed on the surface layer of the superconductive wire material 10.

The critical current of the manufactured superconductive wire material 10 was measured using the four-terminal method with 200 m of the manufactured superconductive wire material 10 being immersed in liquid nitrogen. The measurement was performed by 1 m pitch and the voltage terminal was 1.2 m. The front/back surface roughnesses Ra of the superconductive wire material substrate 1 used at this time are shown in Table 2.

In Table 2, the front/back surface roughnesses Ra of the superconductive wire material substrates of the above-described samples 2-1 to 2-13 and the obtained characteristics of the superconductive wire material are shown.

Here, the surface condition was confirmed such that the surface of the substrate on which the intermediate layer was layered was observed with CCD camera inspection equipment and with visual observation, and it was confirmed whether or not there was a defect such as an irregular color, a linear scratch, or the like. Note that, in Table 2, "A" means that no defect exists, "B" means that an irregular color or a spot defect exists, and "C" means that a linear defect exists.

The critical current characteristic was measured using the four-terminal method with 200 m being immersed in liquid nitrogen. The measurement was performed by 1 m pitch and the voltage terminal was 1.2 m. The conductivity characteristics of the superconductive wire material 10 were performed in definition of 1 μV/cm.

The adhesive condition was evaluated such that the adhesive condition between the back side surface layer and the stabilizing layer (including the protective layer) of the substrate was evaluated. The adhesive condition at this time was confirmed by a bending test method. In this bending test, an exfoliation condition of the back side surface layer of the substrate was evaluated. Specifically, the superconductive wire material (thickness t=0.2 mm) formed up to the stabilizing layer was subjected to a bending deformation ε=2% (ε=t/φ) along a curve of an outer peripheral surface of a cylindrical object (diameter=10 mm) to both of front/back directions of the superconductive wire material. The bending test at this time was performed under a non tension condition, that is, no tension was applied to the superconductive wire material. Note that, in Table 2, "A" means an adhesiveness favorable condition in which an exfoliation portion is not detected in the back side surface layer of the substrate, "B" means a condition in which an exfoliation portion is detected in the back side surface layer of the substrate even a small portion, and "C" means a condition in which an exfoliation portion is detected such that the exfoliation portion exists in more than half of the width direction of the superconductive wire material in the back side surface layer of the substrate.

TABLE 2

| | SAMPLE | 2-1 | 2-2 | 2-3 | 2-4 | 2-5 | 2-6 | 2-7 | 2-8 | 2-9 | 2-10 | 2-11 | 2-12 | 2-13 |
|---|---|---|---|---|---|---|---|---|---|---|---|---|---|---|
| SUBSTRATE STRUCTURE | FRONT SIDE SURFACE ROUGHNESS Ra [nm] | 0.9 | 0.8 | 1.2 | 2.8 | 2.4 | 2.9 | 3.4 | 1.4 | 2.8 | 2.4 | 1.1 | 0.8 | 0.8 |
| | BACK SIDE SURFACE ROUGHNESS Ra [nm] | 10.6 | 9.5 | 9.7 | 10.8 | 13.6 | 8.2 | 12.1 | 8.4 | 15.6 | 24.3 | 7.1 | 6.5 | 5.2 |
| SURFACE CONDITION | FRONT SIDE | A | A | A | A | A | A | A | A | B | B | B | B | B |
| | BACK SIDE | A | A | A | A | A | A | A | A | A | A | B | B | B |
| SUPER-CONDUCTIVITY | CRITICAL CURRENT | 307A | 326A | 295A | 261A | 268A | 240A | 251A | 247A | 232A | 226A | 220A | 206A | 201A |
| BACK SURFACE CONDITION | ADHESIVE | A | A | A | A | A | B | A | B | A | A | C | C | C |

In samples 2-1 to 2-8, the front side surface roughness Ra is 10 nm or less, and the back side surface roughness Ra is 8 nm or more and less than 15 nm.

Meanwhile, in samples 2-11 to 2-13, the back side surface roughness Ra is less than 8 nm, and in samples 2-9 and 2-10, the back side surface roughness Ra is 15 nm or more.

Here, an uneven linear defect having a depth of about 0.1 to 0.5 μm was caused, which may have been formed at the time of forming the intermediate layer and the like on the back side surface of the superconductive wire material substrates of samples 2-11 to 2-13. This is probably because the back side surface roughness Ra was made small, and when the substrate was travelled in order to lay the intermediate layer on the substrate, the linear defect was caused at the time when the susceptor and the back side surface of the substrate contacted with each other. Also, a fine linear defect was caused on the front side surface. This is probably because the front side surface roughness Ra is small and in a smooth condition, and when the substrate was wound around a reel, the front side surface was rubbed with the back side surface, and therefore, the linear defect formed on the back side surface was transferred to the front side surface.

In samples 2-11 to 2-13, the critical current was lowered because the linear defect was formed on the front side surface of the substrate.

Also, in samples 2-11 to 2-13, the adhesiveness between the stabilizing layer formed on the back surface and the substrate was poor. This is probably because of an uneven linear defect caused by the contact of the substrate and the susceptor adhered on the back side surface of the substrate, and fine metal powders.

From the above, it is favorable, like samples 2-1 to 2-10, that the back side surface roughness Ra is 8 nm or more.

On the other hand, the back side surface roughness Ra of the superconductive wire material substrate in samples 2-9 and 2-10 was 15 nm or more. Compared with samples 2-11 to 2-13, although the back side surface condition of the substrate was improved, a spott defect was slightly caused in the front side surface condition of the substrate. This is probably because the front side surface roughness Ra has a low Ra value (3 nm or less) that aims for high orientation, and an unevenness formed on the back side surface due to a high Ra value was transferred to the front side surface.

From this, it is favorable, like samples 2-1 to 2-8, that the back side surface roughness Ra is 8 nm or more and less than 15 nm.

Note that the smaller the surface roughness Ra of the front side substrate is, the more improved the orientation of the intermediate layer formed on the front side substrate is, and the critical current is also improved. However, the front side surface roughness Ra of the substrate is favorably 6 nm or less. Especially, like samples 2-1 to 2-5, in a case where the front side surface roughness Ra is 3 nm or less, the orientation of the intermediate layer is improved and the critical current value becomes a high value like 260 A or more. Meanwhile, in sample 2-7, because the front side surface roughness exceeds 3 nm, the critical current value is slightly smaller than that in sample 2-5 and the like.

Also, in samples 2-6 and 2-8, it is evaluated that because the adhesiveness of the stabilizing layer on the back surface is poor, samples 2-6 and 2-8 are locally subjected to thermal instability, the critical current value is slightly smaller than that of other samples. This can be seen well by comparing the samples 2-6 and 2-8 with samples 2-1 and 2-4, which have an equivalent surface roughness Ra.

Note that, in sample 2-4, the finish polishing process was not performed, and in samples 2-1 to 2-3, 2-5, and 2-6, the finish polishing process was performed. This finish polishing process has not only the purpose of controlling the front side surface roughness Ra, but also the purpose of improving cleanliness of the surface layer such as removal of fine metal particles that were forced into in the rolling process, removal of oil adhered/burned on the surface layer, and removal of an ununiform layer on the surface layer. Therefore, it is favorable to perform the finish polishing process. Also, the polishing process (see step S1) illustrated in the flow diagram of the process of manufacturing the superconductive wire material substrate has an effect of reducing a surface layer defect caused in a casting process and in an upper process of a material in a rough rolling process, such as a defect caused by a material piece of the substrate or a foreign piece that was forced into, or a defect caused by a component that locally fluctuated. Therefore, during the process of manufacturing the superconductive wire material substrate, it is favorable to perform the polishing process, and is more favorable to perform the polishing process multiple times.

In the above samples, non-orientated substrate has been used. However, the present embodiment can be applied to an orientated substrate in which at least the surface of the substrate is orientated.

Conventionally, it is known that the characteristics of the superconductive wire material are improved by making the surface roughness Ra of the superconductive wire material substrate small. However, in a case where the back side surface roughness Ra is reduced in accordance with the front side surface, a defect is more likely to be formed on the back side surface of the superconductive wire material substrate like samples 2-11 to 2-13, and this is not favorable.

For example, as disclosed in Patent Document 4, when the finish rolling is performed with a mirror surface roll, the back side surface roughness Ra is not controlled and the rolling is performed in a similar manner to the front side that is to be polished in the subsequent polishing. Therefore, a problem is caused such that the uniform shape control of a long superconductive wire material substrate exceeding km-order is difficult.

Also, as disclosed in Patent Document 8, before the finish rolling with the mirror surface roll and the like, the back side surface condition has steel unevenness compared with the surface condition after the finish rolling with the mirror surface roll. Therefore, when the substrate is wound around a reel after the front side surface roughness Ra is improved by polishing, the rough back side surface damages the front side surface layer of the substrate.

As described above, according to the present embodiment, a long, less-expensive and mass-produced superconductive wire material substrate having high-strength, high-orientation, and excellent superconductivity can be manufactured. Also, a superconductive wire material using this superconductive wire material substrate can be manufactured.

INDUSTRIAL APPLICABILITY

The present invention can be, because it has been configured as described above, used for a superconductive wire material substrate, a method of manufacturing a superconductive wire material substrate, and a superconductive wire material.

Explanation of Symbols
1 Superconductive wire material substrate
2 Intermediate layer
3 Superconductor layer
10 Superconductive wire material

The invention claimed is:
1. A superconductive wire material substrate, wherein:
a surface roughness Ra of one surface of the superconductive wire material substrate is 10 nm or less, and a surface roughness Ra of an other surface of the superconductive wire material substrate is larger than the surface roughness Ra of the one surface and is 10 nm or more and less than 15 nm,
wherein a difference between the surface roughnesses Ra of the one surface and the other surface is larger than 2 nm and smaller than 10 nm.

2. The superconductive wire material substrate according to claim 1, wherein the surface roughness Ra of the one surface is 6 nm or less.

3. The superconductive wire material substrate according to claim 1, wherein the surface roughness Ra of the one surface is 3 nm or less.

4. The superconductive wire material substrate according to claim 1, wherein the superconductive wire material substrate is a substrate made of a Ni-based alloy or a Fe-based alloy.

5. A method of manufacturing a superconductive wire material substrate, comprising:
cold-rolling a metal body, and
heat-treating the cold-rolled metal body;
wherein the cold-rolling is performed using an upper and lower pair of rolling rolls having different surface roughnesses Ra,
wherein a rolling roll having a smaller surface roughness Ra has a surface roughness Ra of 3 nm or more and less than 60 nm, and
wherein the upper and lower pair of rolling rolls satisfies a condition that a difference between the surface roughnesses Ra is larger than 2 nm and smaller than 10 nm.

6. The method of manufacturing a superconductive wire material substrate according to claim 5, wherein a portion having the surface roughness Ra of 3 nm or more and less than 60 nm in the rolling roll having the smaller surface roughness Ra is within a width range of 0.8 times or more of a material width.

7. The method of manufacturing a superconductive wire material substrate according to claim 5, wherein a difference of outer diameters between the upper rolling roll and the lower rolling roll is 1.5 μm or less.

8. The method of manufacturing a superconductive wire material substrate according to claim 5, wherein the cold-rolling further comprises at least an additional rolling step using an upper and lower pair of rolling rolls having same surface roughness Ra.

9. A superconductive wire material comprising:
a superconductive wire material substrate, between two surface roughnesses Ra of both surfaces of the superconductive wire material substrate, having a surface roughness Ra of one surface of 10 nm or less and a surface roughness Ra of an other surface larger than the one surface roughness Ra and of 10 nm or more and less than 15 nm; an intermediate layer formed on the one surface of the superconductive wire material substrate; and a superconducting layer formed on the intermediate layer,
wherein a difference between the surface roughnesses Ra of the one surface and the other surface is larger than 2 nm and smaller than 10 nm.

* * * * *